United States Patent
Tan et al.

(10) Patent No.: US 9,024,851 B2
(45) Date of Patent: May 5, 2015

(54) ARRAY SUBSTRATE AND LIQUID CRYSTAL DISPLAY UTILIZING THE ARRAY SUBSTRATE

(75) Inventors: Wen Tan, Beijing (CN); Xiaojing Qi, Beijing (CN)

(73) Assignees: Boe Technology Group Co., Ltd., Beijing (CN); Chengdu Boe Optoelectronics Technology Co., Ltd., Chengdu, Sichuan Province (CN)

( * ) Notice: Subject to any disclaimer, the term of this patent is extended or adjusted under 35 U.S.C. 154(b) by 322 days.

(21) Appl. No.: 13/291,231

(22) Filed: Nov. 8, 2011

(65) Prior Publication Data
US 2012/0112987 A1 May 10, 2012

(30) Foreign Application Priority Data
Nov. 8, 2010 (CN) ...................... 2010 2 0601201 U

(51) Int. Cl.
| G09G 3/36 | (2006.01) |
| G02F 1/1362 | (2006.01) |
| H01L 27/12 | (2006.01) |
| G02F 1/1343 | (2006.01) |

(52) U.S. Cl.
CPC ........... *G02F 1/13624* (2013.01); *H01L 27/124* (2013.01); *G02F 2001/134345* (2013.01)

(58) Field of Classification Search
CPC ......................................................... G09G 3/20
USPC .................... 345/32, 50, 55, 87–103; 349/84, 349/139–144
See application file for complete search history.

(56) References Cited

U.S. PATENT DOCUMENTS

| 2005/0001807 A1* | 1/2005 | Lee et al. ......................... 345/92 |
| 2006/0231838 A1* | 10/2006 | Kim ................................. 257/59 |
| 2008/0007506 A1* | 1/2008 | Chen et al. ...................... 345/92 |

* cited by examiner

*Primary Examiner* — Joseph Feild
*Assistant Examiner* — Gustavo Polo
(74) *Attorney, Agent, or Firm* — Ladas & Parry LLP

(57) ABSTRACT

An embodiment of the disclosed technology provides an array substrate, comprising a base substrate, and data lines and gate lines crossed with each other to define a plurality of pixel units on the base substrate, wherein each pixel unit comprises two sub-pixel units, and the data line for the pixel unit is formed between the two sub-pixel units, and each of the two the sub-pixel units comprises a pixel electrode and a thin film transistor (TFT), which comprises a gate electrode, a source electrode, a drain electrode and an active layer.

5 Claims, 3 Drawing Sheets

ARRAY SUBSTRATE AND LIQUID CRYSTAL DISPLAY UTILIZING THE ARRAY SUBSTRATE

BACKGROUND

Embodiments of the disclosed technology relate to an array substrate and a liquid crystal display.

Liquid crystal displays are currently common flat panel displays, and thin film transistor liquid crystal displays (TFT-LCDs) are the main kind of LCDs. FIG. 1A is a schematic partial top view of showing a conventional array substrate of a TFT-LCD, and FIG. 1B is a schematic partial top view of a single pixel unit in FIG. 1A. As shown in FIGS. 1A and 1B, the conventional array substrate comprises: a base substrate 1; data lines 5 and gate lines 2 that are crossed with each other and formed on the base substrate 1; a plurality of pixel units, which are defined by the data lines 5 and the gate lines 2 and arranged into a matrix form. An insulation layer is formed between the gate lines 2 and the data lines 5 to isolate the gate lines 2 and the data lines 5. Each of the pixel units comprises one TFT switch and one pixel electrode 11, and the TFT switch comprise a gate electrode 3, a source electrode 7, a drain electrode 8 and an active layer 6. The gate electrode 3 is connected to one of the gate lines 2, the source electrode 7 is connected to one of the data lines 5, and the drain electrode 8 is connected to the pixel electrode 11. The active layer 6 is formed between the source/drain electrodes 7 and 8 and the gate electrode 3, and a gate insulation layer (not shown) is formed between the gate electrode 3 and the active layer 6. Herein, an overlapping portion of the pixel electrode 11 and a common electrode line 12 forms a storage capacitance Cb, and an overlapping portion of the gate electrode 3 and the source electrode 7 forms a parasitic capacitance Cgs.

As a TFT-LCD with higher image quality and higher resolution is required, the size of a pixel unit of the TFT-LCD becomes smaller and thus, an influence of signal lines, such as a data line and a gate line, in the pixel unit on a pixel electrode is greater. As shown in FIGS. 1A and 1B, the data line 5 is located at one side of the pixel unit and between two adjacent pixel units, and the displacement of the data line 5 may unilaterally influence the parasitic capacitance Cgs of each pixel unit.

If one data line is horizontally displaced due to an exposing process in manufacturing, a difference between the coupling capacitances generated due to data lines in two pixel units adjacent to the displaced data line becomes larger, and a difference between the liquid crystal voltages of the two pixel units thus increases, thus a vertical crosstalk difference occurs and a vertical crosstalk is caused. Further, the displacement of the data line also may cause parasitic capacitance between gate electrodes and source electrodes in some pixel units to increase, and the feed-in voltages of the some pixel units are thus increased, which leads to flicker phenomenon.

SUMMARY

An embodiment of the disclosed technology provides an array substrate, comprising a base substrate, and data lines and gate lines crossed with each other to define a plurality of pixel units on the base substrate, wherein each pixel unit comprises two sub-pixel units, and the data line for the pixel unit is formed between the two sub-pixel units, and each of the two the sub-pixel units comprises a pixel electrode and a thin film transistor (TFT), which comprises a gate electrode, a source electrode, a drain electrode and an active layer; and the data line for the pixel unit is connected to the source electrodes of the TFTs of the two sub-pixel units of the pixel unit, the gate line of the pixel unit is connected to the gate electrodes of the TFTs of the two sub-pixel units of the pixel unit, and the pixel electrodes of the two sub-pixel units are respectively connected to the drain electrodes of the TFTs of the two sub-pixel units of the pixel unit.

An embodiment of the disclosed technology provides a liquid crystal display, comprising a liquid crystal panel, wherein the liquid crystal panel comprises a color filter substrate and the above array substrate, which are assembled together with a liquid crystal layer interposed therebetween.

Further scope of applicability of the disclosed technology will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Embodiments of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

First Embodiment

Figure 1A:
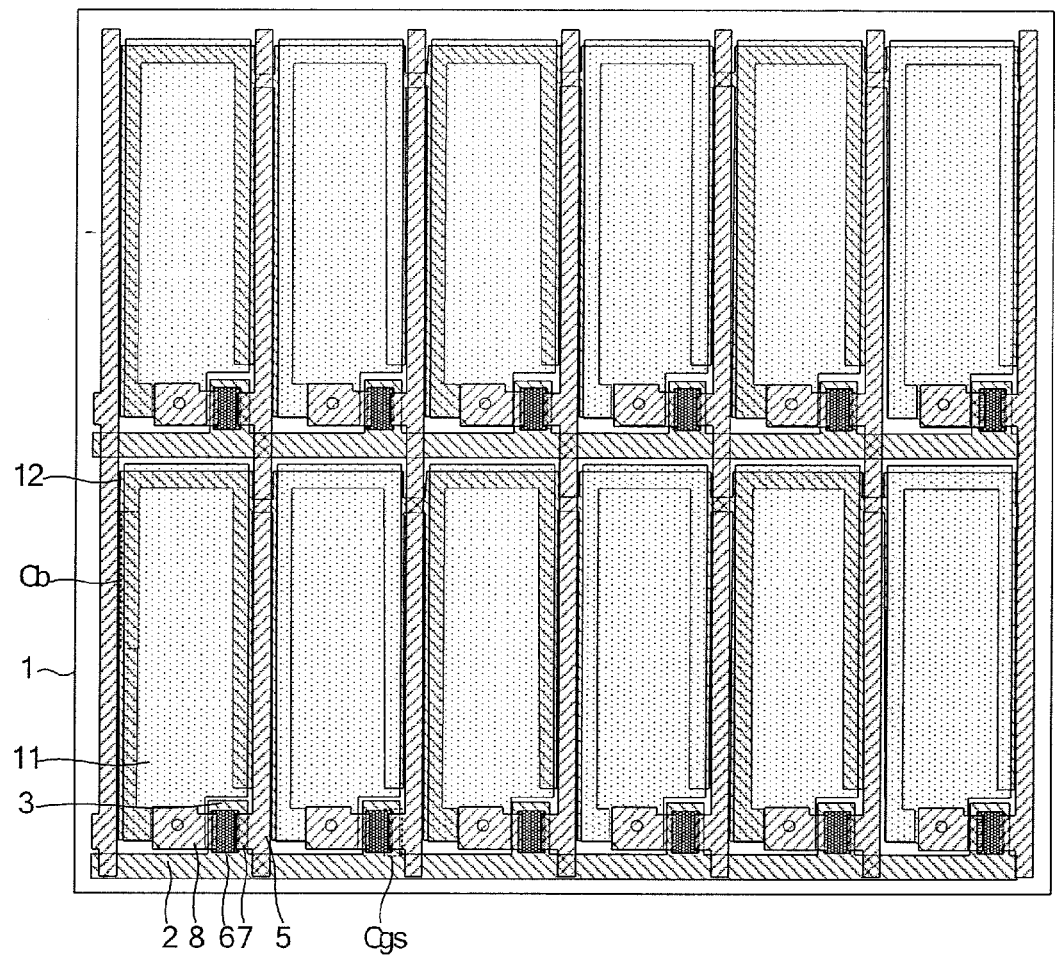
FIG. 1A is a schematic partial top view of showing a conventional array substrate of a TFT-LCD.
Figure 1B:
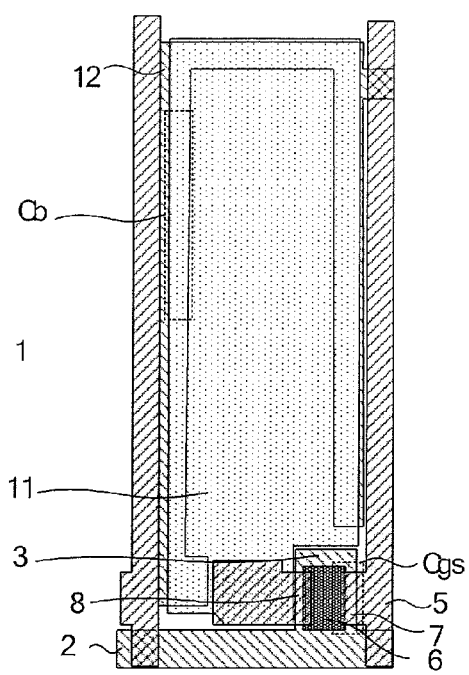
FIG. 1B is a schematic partial top view of a single pixel unit in FIG. 1A.
Figure 2:
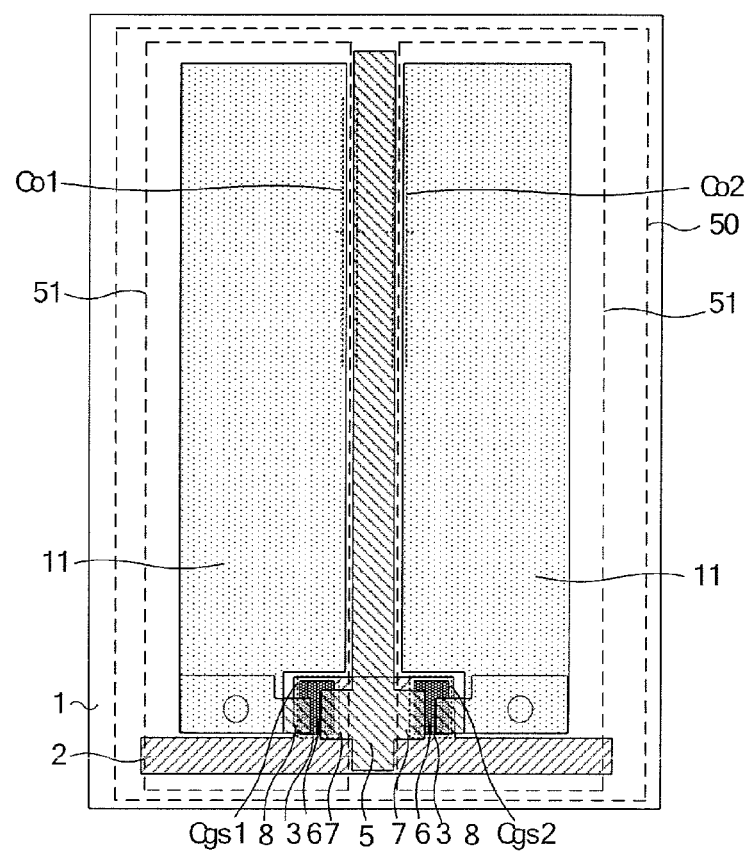
FIG. 2 is a schematic partial top view of showing an array substrate according to a first embodiment of the disclosed technology.

FIG. 2 is a schematic partial top view of showing an array substrate according to a first embodiment of the disclosed technology. As shown in FIG. 2, the array substrate comprises a base substrate 1, data lines 5 and gate lines 2 that are crossed with each other on the base substrate 1, and a plurality of pixel units 50.

Each of the plurality of pixel units 50 comprises two sub-pixel units 51, one data line 5 for the pixel unit 50 is foamed between the two sub-pixel units 51, each of the two sub-pixel units 51 comprises a thin film transistor (TFT) and a pixel electrode 11, and the thin film transistor comprises a gate electrode 3, a source electrode 7, a drain electrode 8 and an active layer 6.

The data line for the pixel unit is respectively connected to the source electrodes of the two sub-pixel units of the pixel unit, the gate line for the pixel unit is respectively connected to the gate electrodes of the TFTs of the two sub-pixel units of the pixel unit and the pixel electrode of each of the two sub-pixel units is connected to the respective drain electrode of the TFTs of the sub-pixel unit.

Herein, the data line 5 of each pixel unit 50 divides the pixel unit 50 into two portions, that is, two sub-pixel units 51, and the two sub-pixel units 51 are respectively positioned on both sides of the data line 5 for the pixel unit 50. Each of the two sub-pixel units 51 comprises a TFT switch, a pixel electrode and a common electrode line, and the two sub-pixel units 51 share the same gate line and the same data line, and the source electrodes of the two sub-pixel units 51 are connected to the same data line. During the LCD is displaying, for each pixel unit the two sub-pixel units 51 can be simultaneously charged or discharged, liquid crystal voltages applied on the pixel electrodes of the sub-pixel units are identical, storage capacitances thereof are identical, the same gray level is displayed in the two sub-pixel units 51 as well, and thus, the two sub-pixel units 51 are regarded as a single pixel unit in viewing.

Given that the pixel unit is used to conduct single domain display, because the data line 5 is located between the pixel electrodes 11 of the two sub-pixel units 51 of the pixel unit 50, the two sub-pixel units are symmetrical to each other about the data line for the pixel unit and the distances from the data line 5 to the pixel electrodes 11 of the two sub-pixel units 51 are identical to each other, a coupling capacitance Co1 between the data line 5 and the pixel electrode 11 of one of the two sub-pixel units 51 is the same as the coupling capacitance Co2 between the data line 5 and the pixel electrode 11 of the other of the two sub-pixel units 51. If the data line 5 is horizontally displaced, the distances between the data line 5 and the pixel electrodes 11 of the two sub-pixel units 51 positioned at the right side and the left side thereof change accordingly, in which one of the distances increases and the other of the distances decreases, and thus, a difference between the coupling capacitance Co1 of the data line 5 and the pixel electrode 11 of one of the two sub-pixel units 51 and the coupling capacitance Co2 of the data line 5 and the pixel electrode 11 of the other of the two sub-pixel units 51 is caused. After charging of current row pixel units is completed, the data line 5 is used to charge the other row pixel units, and when a voltage jumps, a difference between the coupling capacitance Co1 and the coupling capacitance Co2 of the two sub-pixel units of the current row pixel unit occurs, and thus, a difference between gray levels is caused. However, because the two gray levels of the two sub-pixel units are combined as a collective gray level of the pixel unit, and one of the two gray levels increases but the other of the two gray levels decreases, and thus, the increase and the decrease of the two gray levels of the two sub-pixel units offset to each other so that the change of the total gray level of the pixel unit is relatively small. Therefore, when the voltage of one data line 5 jumps, the change of the coupling capacitance of a pixel unit is small, and the influence of the coupling capacitance on the liquid crystal voltage of each pixel unit is relatively small, and the liquid crystal voltages are uniform in the pixel units over the array substrate.

Further, because a parasitic capacitance is formed between a source electrode and a gate electrode of a TFT switch in a pixel unit. In the conventional technology, if a data line 5 is displaced toward the source electrode, an overlapping area between the source electrode and the gate electrode increases, and the parasitic capacitance thus increases so that the feed-in voltage of the TFT switch increases or decreases, which makes different the feed-in voltages of the pixel unit different at different positions on the array substrate, and a serious flicker phenomena is caused. However, in the present embodiment, because each of two sub-pixel units of each pixel unit has its own TFT switch, when the data line 5 for the pixel unit is horizontally displaced, overlapping areas between source/drain electrodes and gate electrode of the TFT switch of each sub-pixel unit are changed. As shown in FIG. 2, if the data line 5 is displaced leftward, a parasitic capacitance $Cgs1$ of a sub-pixel unit positioned at the left side of the data line 5 increases while the parasitic capacitance $Cgs2$ of a sub-pixel unit positioned at the right side of the data line 5 decreases; if the data line is displaced rightward, the parasitic capacitance $Cgs1$ of the sub-pixel unit positioned at the left side of the data line 5 decreases while the parasitic capacitance $Cgs2$ of the sub-pixel unit positioned at the right side of the data line 5 increases. Therefore, when the data line is displaced, influences on the parasitic capacitance $Cgs1$ and the parasitic capacitance $Cgs2$ of two sub-pixel units of the pixel unit are opposite to each other, and the parasitic capacitance $Cgs1$ and the parasitic capacitance $Cgs2$ can be offset to each other and self-compensation of the parasitic capacitances of the two sub-pixel units of the pixel unit can be achieved.

Each pixel unit of the array substrate according to the present embodiment comprises two sub-pixel units and the data line for the pixel unit is formed between the two sub-pixel units, and when the data line is displaced, the coupling capacitances between the data line and the pixel electrodes of the two sub-pixel units become different from each other so that changes of the two gray levels of the two sub-pixel units are offset to each other, and the influence of the displacement of the data line on a liquid crystal voltage of the pixel unit is alleviated, and crosstalk can be suppressed. In addition, self-compensation of the parasitic capacitances of the two sub-pixel units of the pixel unit can be achieved, and thus, a flicker phenomenon is suppressed.

Second Embodiment

Figure 3:
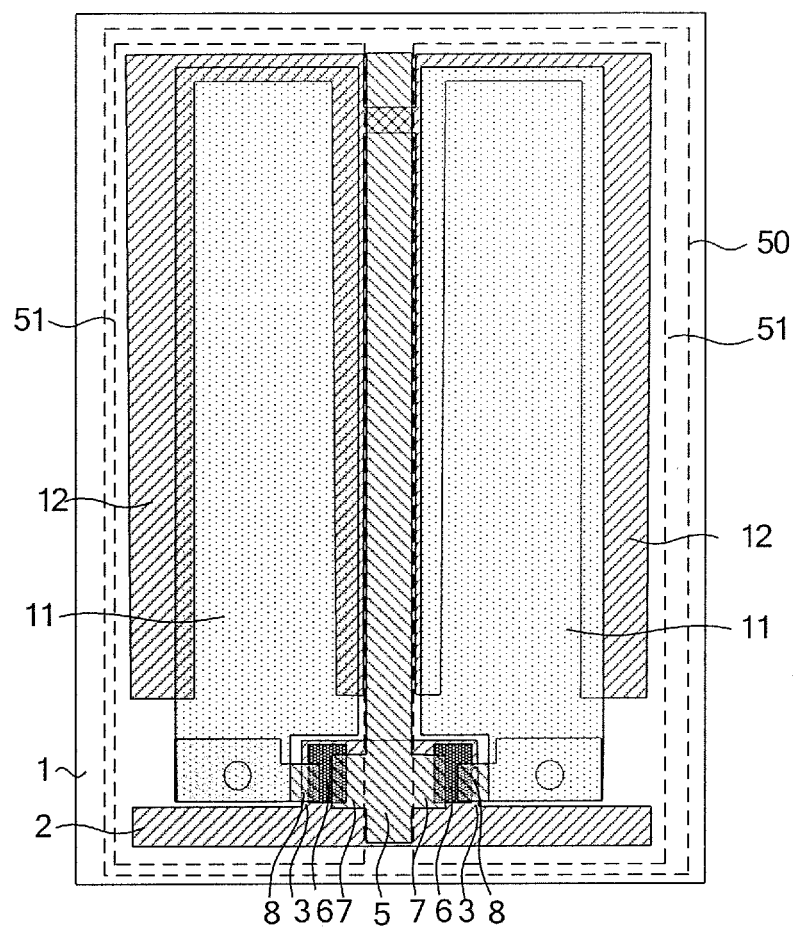
FIG. 3 is a schematic partial top view of showing an array substrate according to a second embodiment of the disclosed technology.

FIG. 3 is a schematic partial top view of showing an array substrate according to a second embodiment of the disclosed technology. As shown in FIG. 3, the array substrate comprises a base substrate 1, data lines 5 and gate lines 2 which are crossed with each other on the base substrate 1 and a plurality of pixel units 50.

Each of the plurality of pixel units 50 comprises two sub-pixel units 51, a data line 5 for each of the plurality of pixel units 50 is formed between the two sub-pixel units 51, each of the two sub-pixel units 51 comprises a thin film transistor and a pixel electrode 11, the thin film transistor comprises a gate electrode 3, a source electrode 7, a drain electrode 8 and an active layer 6.

The data line 5 for the pixel unit 50 is respectively connected to the source electrodes 7 of the TFTs of the two sub-pixel units 51 of the pixel unit, the gate line 2 for the pixel unit 50 is respectively connected to the gate electrodes 3 of the TFTs of the two sub-pixel units 51 of the pixel unit, and the pixel electrode of each of the two sub-pixel units is connected to the drain electrode of the respective sub-pixel unit.

Further, a common electrode line 12 for each pixel unit is formed in the same layer as the gate line on the base substrate 1 of the array substrate.

In addition, the common electrode line 12 may be disposed below the data line 5 and respectively insulated from the common electrode line 12, the data line 5 and the pixel electrode 11, and the common electrode line 12 and the pixel electrode 11 overlaps at least in part. Further, the common electrode line 12 may comprises a portion between the two sub-pixel units of the pixel unit or a portion between the two sub-pixel units 51 of one pixel unit 50.

The data line 5 for the pixel unit 50 is respectively connected to the source electrodes 6 of the TFTs of the two sub-pixel units 51 of the pixel unit, the gate line 2 of the pixel unit 50 is respectively connected to the gate electrodes 3 of the TFTs of the two sub-pixel units 51 of the pixel unit. The pixel electrodes 11 of the two sub-pixel units 51 are respectively connected to the respective drain electrodes 8.

In the present embodiment, the coupling capacitances between the data line and the pixel electrodes and between the common electrode line and the pixel electrodes of two sub-pixel units become different so that changes of two gray levels of the two sub-pixel units are offset to each other, and the influence of the displacement of the data line on a liquid crystal voltage of the pixel unit is weakened, and crosstalk can be suppressed. In addition, self-compensation of the parasitic capacitances of the two sub-pixel units of the pixel unit are compensated to each other, self-compensation can be achieved, and therefore a flicker phenomenon is suppressed.

In addition, the pixel unit 50 may be a pixel unit having a double-domain structure, wherein ratios of channel width to channel length of the TFT switches of the two sub-pixel units of the pixel unit 50 are formed different from each other. Because turning-on currents of the TFTs with the different ratios of channel width to channel length are different from each other under the same data line voltage and the same gate line voltage, the two sub-pixel unit of one pixel unit can be supplied with different liquid crystal voltages by setting a charging time period, and the different liquid crystal voltages can be supplied for the different domains so that liquid crystal molecules in the different domains have different twisting angles, and the double-domain display can be achieved. Otherwise, areas of the pixel electrodes of the two sub-pixel units of the pixel unit are different from each other, and after being charged, voltages of the pixel electrodes of the two sub-pixel units are different from each other, and therefore a double-domain display can be achieved.

Third Embodiment

A third embodiment of the disclosed technology provides a liquid crystal display comprising a liquid crystal panel, wherein the liquid crystal panel comprises a color filter substrate and an array substrate according to any above embodiment of the disclosed technology assembled together with a liquid crystal layer interposed therebetween.

Because a data line of the array substrate is located in a middle of one pixel unit, which position corresponds to a portion of the color filter substrate necessary to be blocked by a black matrix (BM). The position located between the different pixel units may be not blocked by the BM but by a common electrode line formed in the same layer as a gate line and comprising a portion corresponding to that between the two pixel units.

In the present embodiment, the coupling capacitances between the data line and the pixel electrodes and between the common electrode line and the pixel electrodes of two sub-pixel units are changed oppositely so that changes of two gray levels of the two sub-pixel units are offset to each other, and the influence of the displacement of the data line on a liquid crystal voltage of the pixel unit is weakened, and crosstalk can be suppressed. In addition, self-compensation of the parasitic capacitances of the two sub-pixel units of the pixel unit can be achieved, and therefore a flicker phenomenon can be suppressed.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An array substrate, comprising:
   a base substrate, and
   data lines and gate lines crossed with each other to define a plurality of pixel units on the base substrate, wherein:
   each pixel unit comprises two sub-pixel units, and the data line for the pixel unit is formed between the two sub-pixel units, and each of the two sub-pixel units comprises a pixel electrode and a thin film transistor (TFT), which comprises a gate electrode, a source electrode, a drain electrode and an active layer; and
   the data line for the pixel unit is connected to the source electrodes of the TFTs of the two sub-pixel units of the pixel unit, the gate line of the pixel unit is connected to the gate electrodes of the TFTs of the two sub-pixel units of the pixel unit, and the pixel electrodes of the two sub-pixel units are respectively connected to the drain electrodes of the TFTs of the two sub-pixel units of the pixel unit,
   wherein ratios of a channel width to a channel length of the thin film transistors of the two sub-pixel units of the pixel unit are different from each other,
   wherein the array substrate further comprises a common electrode line for each pixel unit, which is formed in the same layer as the gate lines on the base substrate, the common electrode line comprises a main body being parallel to the gate line and three branches extended from the main body, where one of the three branches is parallel to the data line and overlaps the data line, and the remaining two branches of the three branch are parallel to the data line and are respectively positioned between two adjacent pixel units.

2. The array substrate according to claim 1, wherein the two sub-pixel units of the pixel unit are symmetrical about the date line for the pixel unit.

3. The array substrate according to claim 1, wherein areas of the pixel electrodes of the two sub-pixel units of the pixel unit are different from each other.

4. The array substrate according to claim 1, wherein the common electrode line and the pixel electrode are overlapped at least in part.

5. A liquid crystal display, comprising a liquid crystal panel, wherein the liquid crystal panel comprises a color filter substrate and an array substrate according to claim 1 which are assembled together with a liquid crystal layer interposed therebetween.

* * * * *